(12) United States Patent
Song

(10) Patent No.: US 9,030,898 B2
(45) Date of Patent: May 12, 2015

(54) SEMICONDUCTOR DEVICE

(71) Applicant: SK Hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/098,121

(22) Filed: Dec. 5, 2013

(65) Prior Publication Data

US 2014/0355368 A1  Dec. 4, 2014

(30) Foreign Application Priority Data

May 28, 2013 (KR) .................. 10-2013-0060488

(51) Int. Cl.
| | |
|---|---|
| *G11C 8/06* | (2006.01) |
| *G11C 8/04* | (2006.01) |
| *G11C 29/00* | (2006.01) |
| *G11C 11/418* | (2006.01) |

(52) U.S. Cl.
CPC ........ *G11C 29/76* (2013.01); *G11C 8/06* (2013.01); *G11C 8/04* (2013.01); *G11C 11/418* (2013.01)

(58) Field of Classification Search
CPC ........ G11C 29/76; G11C 11/418; G11C 8/04; G11C 8/06

USPC .......... 365/200, 230.08, 230.01, 189.07, 240

See application file for complete search history.

(56) References Cited

U.S. PATENT DOCUMENTS

| | | | |
|---|---|---|---|
| 5,758,056 A * | 5/1998 | Barr ........................... | 714/6.32 |
| 2003/0058711 A1 * | 3/2003 | Benedix et al. ............. | 365/200 |
| 2004/0130953 A1 * | 7/2004 | Ambroggi et al. ........... | 365/200 |
| 2006/0140027 A1 * | 6/2006 | Tominaga .................... | 365/200 |
| 2008/0191990 A1 * | 8/2008 | Matsubara et al. ........... | 345/98 |
| 2010/0157703 A1 * | 6/2010 | Fischer et al. .............. | 365/200 |
| 2012/0120733 A1 | 5/2012 | Son et al. | |
| 2012/0188830 A1 | 7/2012 | Jeong | |

* cited by examiner

*Primary Examiner* — Ly D Pham

(74) *Attorney, Agent, or Firm* — IP & T Group LLP

(57) ABSTRACT

An embodiment of the present invention provides a semiconductor, including a non-volatile storage unit suitable for storing one or more first addresses; an address storage unit suitable for storing the first addresses sequentially received from the non-volatile storage unit as second addresses while deleting previously stored second addresses identical to an input address of the first addresses, in a reset operation; and a cell array suitable for replacing one or more normal cells with one or more redundancy cells based on the second addresses in an access operation.

18 Claims, 6 Drawing Sheets

SEMICONDUCTOR DEVICE

CROSS-REFERENCE TO RELATED APPLICATION

The present application claims priority of Korean Patent Application No. 10-2013-0060488, filed on May 28, 2013, which is incorporated herein by reference in its entirety.

BACKGROUND

1. Field

Exemplary embodiments of the present invention relate to a semiconductor device and a semiconductor system, and more particularly, to a technique for preventing data from being redundantly stored when data stored in a non-volatile storage unit of a semiconductor device is stored in a storage unit of the semiconductor device.

2. Description of the Related Art

FIG. 1 is a block diagram illustrating a repair operation in a known semiconductor memory device.

Referring to FIG. 1, the semiconductor memory device includes a cell array 110 configured to include a plurality of memory cells, a row circuit 120 configured to activate a word line in response to a row address R_ADD, and a column circuit 130 configured to access (read or write) data of a bit line selected in response to a column address C_ADD.

A row fuse circuit 140 stores a row address, corresponding to a defective memory cell within the cell array 110, as a repair row address REPAIR_R_ADD. A row comparison unit 150 compares the repair row address REPAIR_R_ADD, stored in the row fuse circuit 140, with the row address R_ADD received from the outside of the memory device. When the repair row address REPAIR_R_ADD is identical to the row address R_ADD, the row comparison unit 150 controls the row circuit 120 to activate a redundancy word line designated by the repair row address REPAIR_R_ADD instead of the word line designated by the row address R_ADD.

A column fuse circuit 150 stores a column address, corresponding to the defective memory cell within the cell array 110, as a repair column address REPAIR_C_ADD. A column comparison unit 170 compares the repair column address REPAIR_C_ADD, stored in the column fuse circuit 160, with the column address C_ADD received from the outside of the memory device. When the repair column address REPAIR_C_ADD is identical to the column address C_ADD, the column comparison unit 170 controls the column circuit 130 to access a redundancy bit line designated by the repair column address REPAIR_C_ADD instead of the bit line designated by the column address C_ADD.

Laser fuses are used in the fuse circuits 140 and 160 of FIG. 1. The laser fuse stores 'high' or 'row' data depending on whether or not the laser fuse has been cut. The laser fuse may be programmed in a wafer state but may not be programmed after a wafer is mounted within a package. Furthermore, it is impossible to design the laser fuse small due to the limit of a pitch. A fuse that may be used to overcome this disadvantage is an E-fuse. The E-fuse may be formed of a transistor or a capacitor-resistor. When the E-fuse is formed of a transistor, data is stored by changing resistance between a gate and drain/source of the transistor.

FIG. 2 is a diagram illustrating an E-fuse formed of a transistor operating as a resistor or a capacitor.

As illustrated in FIG. 2, the E-fuse includes a transistor T. When a voltage against which the transistor T may withstand is applied to a gate G of the transistor T, the E-fuse operates as a capacitor C. Accordingly, current does not flow between the gate G and drain/source D/S of the transistor T. When a high voltage against which the transistor T may not withstand is applied to the gate G, a gate oxide of the transistor T is broken and thus the gate G and the drain/source D/S are shorted. As a result, the E-fuse operates as a resistor R. Accordingly, current flows between the gate G and the drain/source D/S.

The data of the E-fuse is recognized based on a resistance value between the gate G and the drain/source D/S of the E-fuse. To recognize the data of the E-fuse, either (1) a first method of directly recognizing the data of the E-fuse by increasing a size of the transistor T without an additional sensing operation or (2) a second method of recognizing the data of the E-fuse by sensing current flowing into the transistor T using an amplifier may be used. The two methods have a limitation in view of a circuit area because the size of the transistor T forming the E-fuse must be designed large or the amplifier for amplifying the data must be provided in each E-fuse.

To apply an E-fuse to the fuse circuits 140 and 160 of FIG. 1 is difficult due to the above-described issues regarding the circuit area. Accordingly, a method of configuring E-fuses in an array form so that the total area may be reduced because amplifiers may be shared and performing a repair operation using data stored in the E-fuse array is being described.

SUMMARY

In a semiconductor device including a non-volatile storage unit, such as an E-fuse array, in order to use data stored in the E-fuse array, the data stored in the E-fuse array are transferred to a storage unit (e.g., register) included in the semiconductor device at the time of resetting. When redundant data are stored in the non-volatile storage unit and the redundant data are transferred to the storage unit, an error may occur in an operation of the semiconductor device.

An embodiment of the present invention is directed to providing a semiconductor device and a semiconductor system, capable of preventing an error from occurring in an operation of the semiconductor device, wherein redundant data is not stored in the storage unit of the semiconductor device when data stored in the non-volatile storage unit of the semiconductor device are transferred to the storage unit of the semiconductor device.

In accordance with an embodiment of the present invention, a semiconductor device may include a non-volatile storage unit suitable for storing one or more first addresses, an address storage unit suitable for storing the first addresses sequentially received from the non-volatile storage unit as second addresses while deleting previously stored second addresses identical to an input address of the first addresses, in a reset operation, and a cell array suitable for replacing one or more normal cells with one or more redundancy cells based on the second addresses in an access operation.

In accordance with another embodiment of the present invention, a semiconductor system may include a semiconductor device, wherein the semiconductor device includes a non-volatile storage unit for storing one or more first addresses, an address storage unit for storing the first addresses sequentially received from the non-volatile storage unit as second addresses in response to a reset command while deleting previously store second addresses identical to an input address of the first addresses, and a cell array for replacing one or more normal cells with one or more redundancy cells based on the second addresses in response to an access command, and a controller suitable for outputting one or more signals of a reset command, the access command and an access address to the semiconductor device.

The semiconductor device may compare the access address with the second addresses, access the normal cells corresponding to the access address when all of the second addresses are identical to the access address, and access the redundancy cells replacing the normal cells corresponding to the access address when any of the second addresses is identical to the access address, in the access operation.

The address storage unit may include first to Nth storage units each suitable for storing one of the second addresses, and first to Nth comparison units suitable for comparing the second addresses with one of the input address and an access address and generating respective first to Nth comparison signals.

The first to Nth storage units may be sequentially activated, and the input address is stored in an activated storage unit of the first to Nth storage units, in a reset operation.

The first to Nth comparison units may activate the respective first to Nth comparison signals and a storage unit corresponding to an activated comparison signal, from among the first to Nth storage units, is reset, when the input address is identical to the second addresses, in the reset operation.

All of the first to Nth storage units may be deactivated, and the first to Nth comparison units activate the respective first to Nth comparison signals when the second addresses are identical to the access address, in the access operation.

The semiconductor device may access the redundancy cells corresponding to an activated comparison signal of the first to Nth comparison signals when any of the first to Nth comparison signals is activated, but accesses the normal cells corresponding to the access address when all of the first to Nth comparison signals are deactivated.

In accordance with yet another embodiment of the present invention, a semiconductor device may include a non-volatile storage unit; first to Nth storage units sequentially activated and suitable for storing input data received from the non-volatile storage unit when the first to Nth storage units are activated, and first to Nth comparison units suitable for comparing data, stored in the respective first to Nth storage units, with the input data, wherein a storage unit which stores data identical to the input data, from among the first to Nth storage units, is reset based on a comparison result of the first to Nth comparison units.

In accordance with still another embodiment of the present invention, a semiconductor device may include a non-volatile storage unit suitable for storing one or more first addresses, an address storage unit suitable for storing the first addresses sequentially received from the non-volatile storage unit while not storing an input address of the first addresses when any of the previously stored second addresses is identical to the input address, in a reset operation, and a cell array suitable for replacing one or more normal cells with one or more redundancy cells based on the second addresses, in an access operation.

In accordance with still another embodiment of the present invention, a semiconductor device may include a semiconductor device, wherein the semiconductor device may include a non-volatile storage unit for storing one or more first addresses, an address storage unit for storing the first addresses sequentially received from the non-volatile storage unit as second addresses in response to a reset command while not storing an input address of the first addresses when any of the previously stored second addresses is identical to the input address, and a cell array for replacing one or more normal cells with one or more redundancy cells based on the second addresses in response to an access command, and a controller suitable for outputting one or more signals of a reset command, the access command and an access address to the semiconductor device.

DETAILED DESCRIPTION

Figure 1:
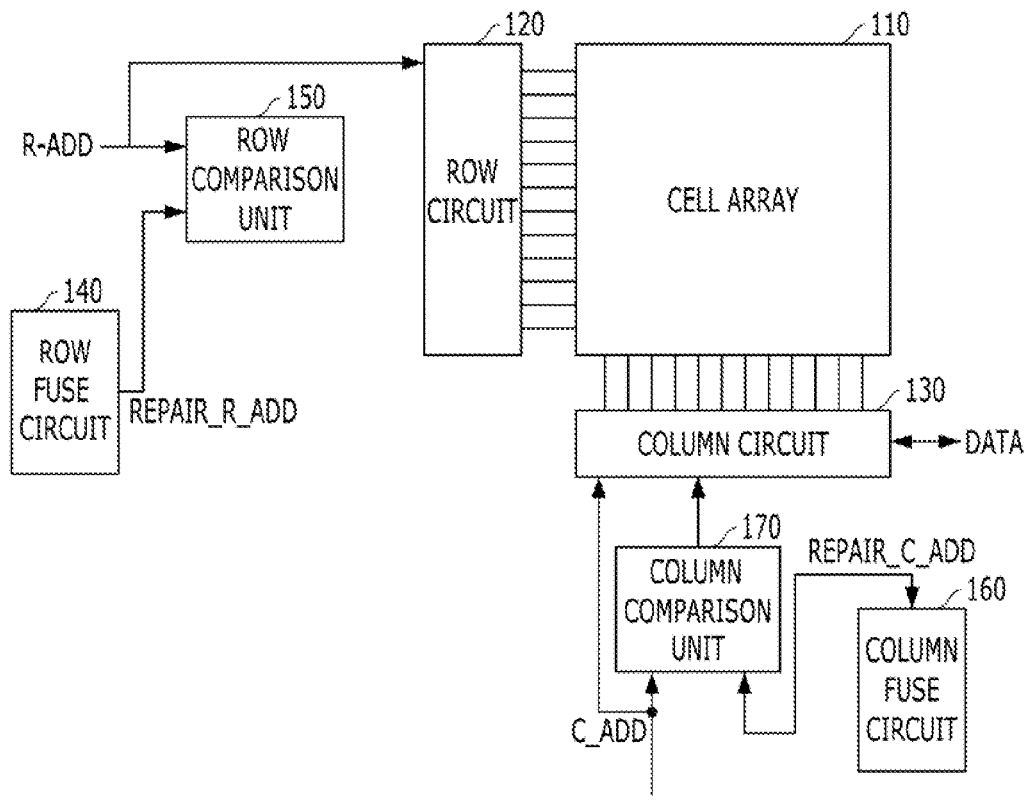
FIG. 1 is a block diagram illustrating a repair operation in a known memory device.
Figure 2:
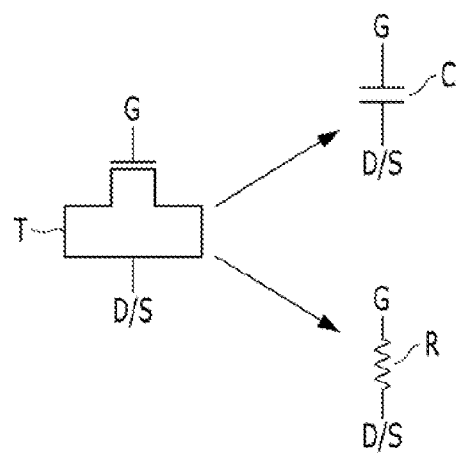
FIG. 2 is a circuit diagram illustrating an E-fuse formed of a transistor operating as a resistor or a capacitor.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

Hereinafter, to replace a normal cell N_CELL with a redundancy cell R_CELL means that the redundancy cell R_CELL replacing the normal cell N_CELL is accessed instead of the replaced normal cell N_CELL, when an input address is identical to an address of the replaced normal cell N_CELL during an access operation of a semiconductor device.

Figure 3:
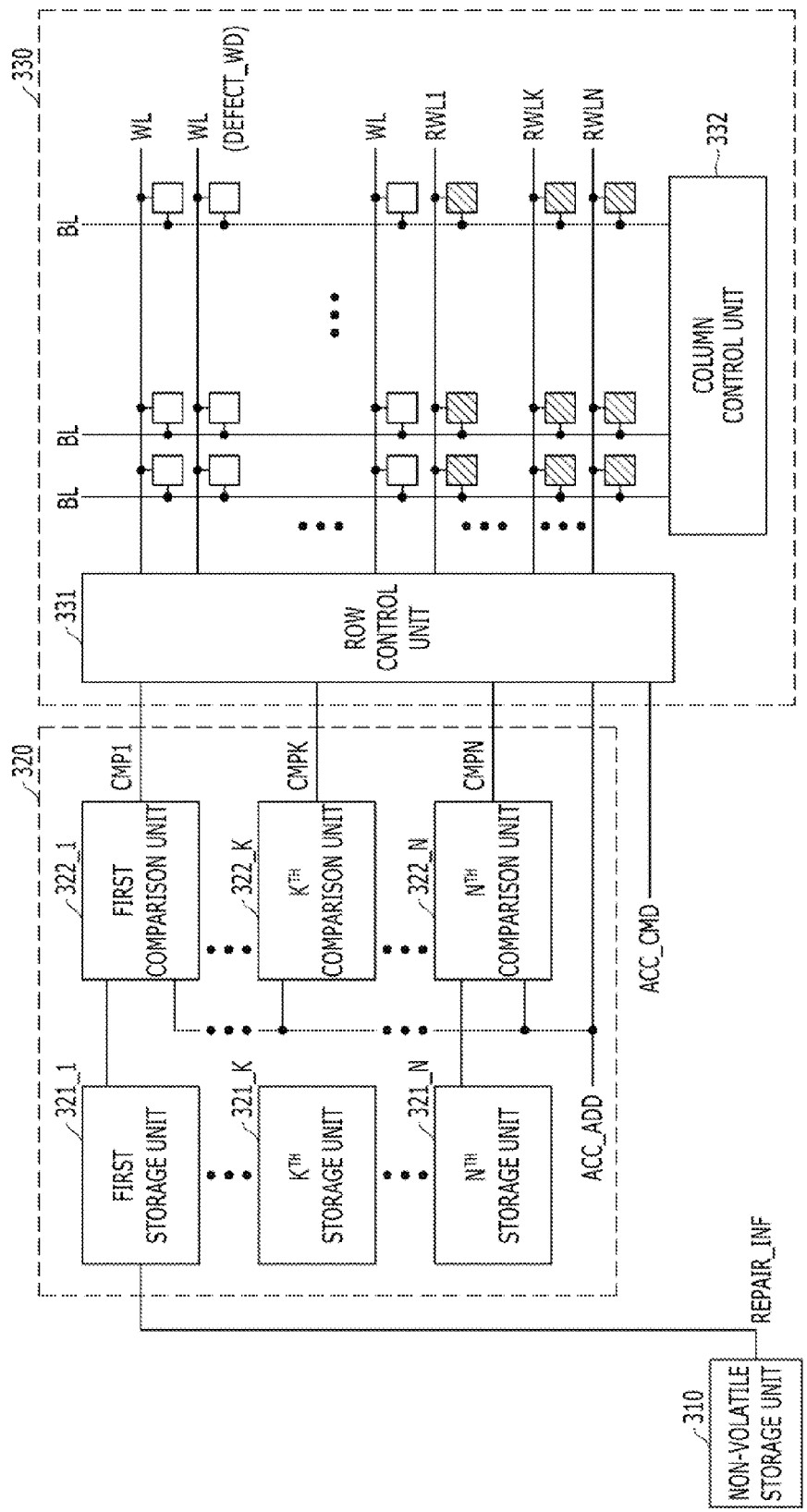
FIG. 3 is a block diagram illustrating concerns occurring when redundant data is inputted from a non-volatile storage unit to an address storage unit.

FIG. 3 is a block diagram illustrating concerns occurring when redundant data is inputted from a non-volatile storage unit 310 to an address storage unit 320.

The semiconductor memory device 300 may include the non-volatile storage unit 310, the address storage unit 320, and a cell array 330. The address storage unit 320 includes a plurality of storage units 321_1 to 321_N and a plurality of comparison units 322_1 to 322_N.

The cell array 330 includes a plurality of normal cells N_CELL and a plurality of redundancy cells R_CELL. The normal cells N_CELL and the redundancy cells R_CELL are coupled with word lines WL and RWL1 to RWLN and bit lines BL. The cell array 330 includes a row control unit 331 and a column control unit 332 for controlling the normal cells N_CELL and the redundancy cells R_CELL. The row control unit 331 activates a word line, which is selected in response to an access address ACC_ADD or comparison signals CMP1 to CMPN, in response to an access command ACC_CMD, and the column control unit 332 accesses the data of the selected bit line. The operation of the row control unit 331 is mainly described below.

During an access operation, the row control unit 331 activates a normal word line WL corresponding to the access address ACC_ADD and accesses normal cells N_CELL, or activates a redundancy word line RWL corresponding to the comparison signals CMP1 to CMPN and accesses redundancy cells R_CELL. For reference, the access operation may be any one of a write operation for writing data into a memory cell, a read operation for reading data from a memory cell, and a refresh operation for refreshing data stored in a memory cell.

The non-volatile storage unit 310 stores repair information REPAIR_INF about the cell array 330, that is, one or more addresses of normal cells to be replaced. The repair information REPAIR_INF may be the addresses of defective normal cells N_CELL detected by a test operation performed on the semiconductor device.

When the semiconductor device performs a reset operation, the address storage unit 320 stores the repair information REPAIR_INF received from the non-volatile storage unit 310. The first to $N^{th}$ storage units 321_1 to 321_N store one or more addresses included in the repair information REPAIR_INF. The first to $N^{th}$ comparison units 322_1 to 322_N compare the access address ACC_ADD with addresses stored in the respective storage units 321_1 to 321_N in an access operation and activate the first to $N^{th}$ comparison signals CMP1 to CMPN, respectively.

A concern that may occur when two or more redundant addresses are stored in the address storage unit 320 is described below based on the above description. Hereinafter, an address stored in the non-volatile storage unit 310 refers to an address of a word line that needs to be replaced. The first to $N^{th}$ comparison signals CMP1 to CMPN correspond to the first to $N^{th}$ redundancy word lines RWL1 to RWLN, respectively.

A semiconductor device undergoes several tests in the manufacturing process, and an address of a defective word line detected in each test stage is stored in the non-volatile storage unit 310. Here, it is assumed that an address corresponding to a defective word line DEFECT_WL is detected in two different test stages, and the same address is redundantly stored in the non-volatile storage unit 310.

When the semiconductor device is reset, the repair information REPAIR_INF of the non-volatile storage unit 310 is inputted to the address storage unit 320 and stored therein. The repair information REPAIR_INF includes the two addresses of the defective word line DEFECT_WL. One or more addresses received from the non-volatile storage unit 310 are stored in the respective first to $N^{th}$ storage units 321_1 to 321_N of the address storage unit 320. For example, it is assumed that the two addresses of the defective word line DEFECT_WL are stored in the first storage unit 321_1 and the $K^{th}$ storage unit 321_K.

In order to perform an access operation on the semiconductor device after the reset operation of the semiconductor device is completed, the access command ACC_CMD and the access address ACC_ADD are inputted to the semiconductor device from the outside. The first to $N^{th}$ comparison units 322_1 to 322_N compare the access address ACC_ADD with the addresses stored in the storage units 321_1 to 321_N, respectively. When the access address ACC_ADD is identical to the addresses, the first to $N^{th}$ comparison units 322_1 to 322_N activate the respective comparison signals CMP1 to CMPN. When all of the first to $N^{th}$ comparison signals CMP1 to CMPN are deactivated, the row control unit 331 activates a normal word line corresponding to the access address ACC_ADD. When any of the first to $N^{th}$ comparison signals CMP1 to CMPN is activated, the row control unit 331 activates a redundancy word line corresponding to an activated comparison signal.

When an address corresponding to the defective word line DEFECT_WL, together with the access command ACC_CMD for accessing the semiconductor device, is received, both the first comparison signal CMP1 and the $K^{th}$ comparison signal CMPN are activated at the same time because the addresses stored in the first storage unit 321_1 and the $K^{th}$ storage unit 321_K are identical to the address of the defective word line DEFECT_WL. Accordingly, there is a concern in that the first redundancy word line RWL1 and the $K^{th}$ redundancy word line RWLK are simultaneously activated in the cell array 330.

Figure 4:
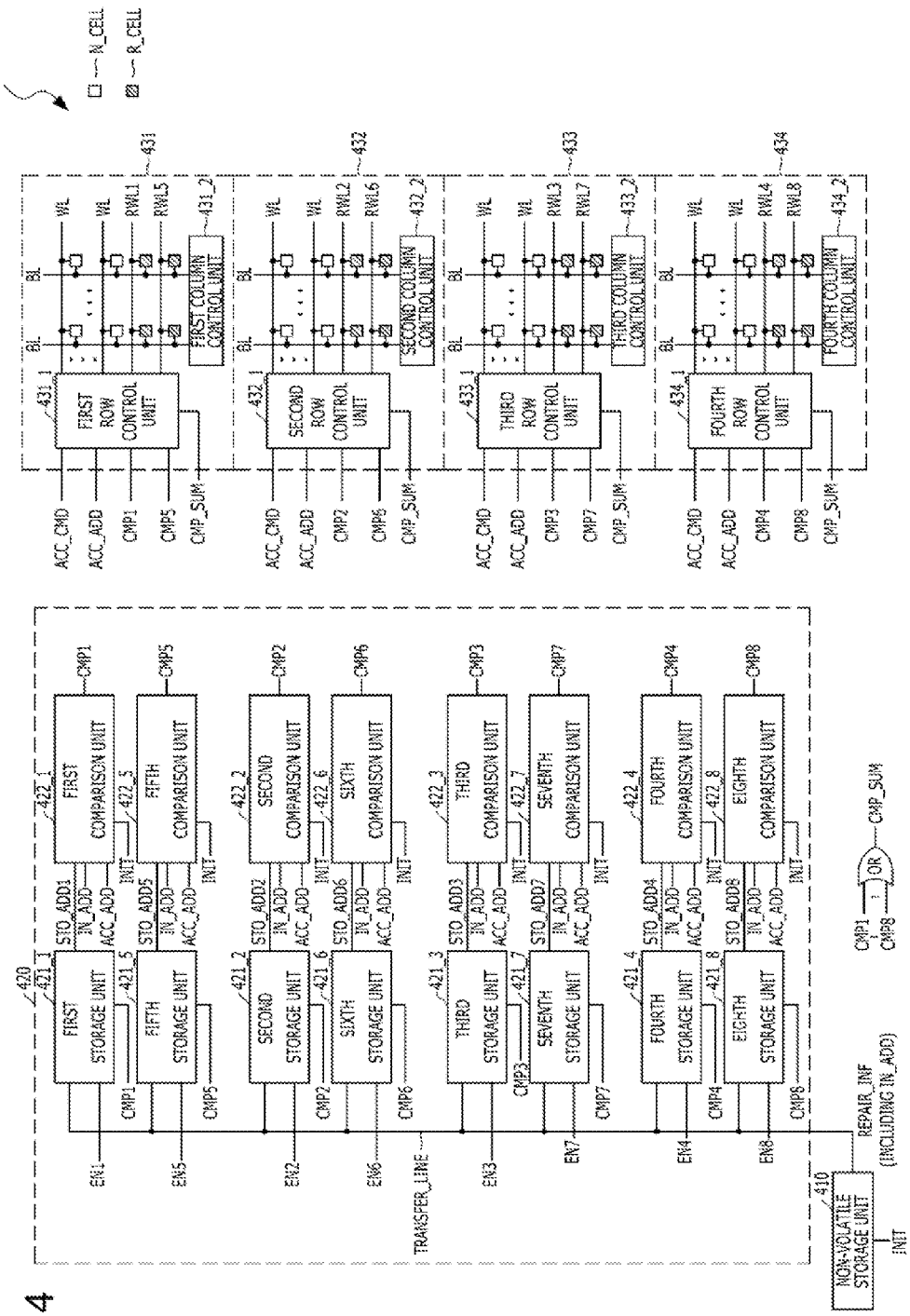
FIG. 4 is a block diagram illustrating a semiconductor device in accordance with an exemplary embodiment of the present invention.

FIG. 4 is a block diagram illustrating a semiconductor device in accordance with an exemplary embodiment of the present invention.

Referring to FIG. 4, the semiconductor device includes a non-volatile storage unit 410 for storing one or more first addresses, an address storage unit 420 for storing the first addresses sequentially received from the non-volatile storage unit 410 as second addresses STO_ADD1 to STO_ADD8 in a reset operation while deleting previously stored second addresses identical to a current input address IN_ADD of the first addresses to be stored, and a cell array 430 for replacing one or more normal cells N_CELL with one or more redundancy cells R_CELL using the second addresses STO_ADD1 to STO_ADD8 stored in the address storage unit 420 at the time of an access operation.

The semiconductor device is described below with reference to FIG. 4. An example in which the semiconductor device is a semiconductor memory device is described below.

The fuse circuits 140 and 160 of FIG. 1 are replaced with the non-volatile storage unit 410 of FIG. 4. The non-volatile storage unit 410 stores repair information corresponding to the cell array 430, e.g., addresses of normal cells to be replaced. The non-volatile storage unit 410 may include an E-fuse array or various types of non-volatile memory, such as flash memory and EEPROM. The non-volatile storage unit 410 outputs repair information REPAIR_INF, which is received through a transfer line TRANSFER_LINE and stored therein, to the address storage unit 420 in the reset operation. The repair information REPAIR_INF includes the first addresses, and the first addresses are sequentially inputted to the address storage unit 420 in the reset operation.

Meanwhile, the non-volatile storage unit 410 may store a row address for controlling a row redundancy operation and a column address for controlling a column redundancy operation. In order to describe the operation of the semiconductor device, it is hereinafter assumed that, in the case of a row redundancy operation, row addresses are stored in the non-volatile storage unit 410, and the row addresses are inputted to the address storage unit 420 and stored therein as the repair information REPAIR_INF in the reset operation. A detailed description of the column redundancy operation is omitted below.

The address storage unit 420 stores the first addresses sequentially received from the non-volatile storage unit 410 as the second addresses STO_ADD1 to STO_ADD8 in the reset operation, and deletes the previously stored second addresses, which are identical to the current input address IN_ADD of the first addresses. Here, the first and second addresses may correspond to the row addresses, and the previously stored second addresses refer to an address received and stored prior to the current input address IN_ADD in the reset operation.

The address storage unit 420 includes first to $N^{th}$ storage units 421_1 to 421_8 for storing the first addresses as the second addresses one to one, and first to $N^{th}$ comparison units 422_1 to 422_8 for comparing the second addresses with one of the input address IN_ADD and an access address ACC_ADD and generating respective first to $N^{th}$ comparison signals CMP1 to CMP8, respectively. A comparison result signal CMP_SUM is a signal activated when any of the first to $N^{th}$ comparison signals CMP1 to CMP8 is activated.

When the first to $N^{th}$ storage units 421_1 to 421_8 are activated, they store the input address IN_ADD of the first addresses. The first to $N^{th}$ storage units 421_1 to 421_8 are sequentially activated in the reset operation. For example, the first storage unit 421_1 to the $N^{th}$ storage unit 421_N may be sequentially activated. All of the first to $N^{th}$ storage units 421_1 to 421_8 are deactivated in the access operation. A reset signal INIT indicates whether the semiconductor device is in the reset operation or not. The reset signal INIT is activated when the semiconductor device is in the reset operation and is deactivated when the semiconductor device is in the access operation. The first to $N^{th}$ storage units 421_1 to 421_8 may be sequentially activated when the reset signal INIT is activated and may be deactivated when the reset signal INIT is deactivated.

For reference, the second addresses STO_ADD1 to STO_ADD8 are stored in the respective first to $N^{th}$ storage units 421_1 to 421_8 and outputted therefrom. Furthermore, first to $N^{th}$ enable signals EN1 to EN8 correspond to the respective first to $N^{th}$ storage units 421_1 to 421_8, and the first to $N^{th}$ storage units 421_1 to 421_8 may be activated when the respective enable signals are activated. The first to $N^{th}$ enable signals EN1 to EN8 may be sequentially activated so that activation sections do no overlap with each other in a section in which the reset signal INIT has been activated.

In the reset operation, a storage unit in which an address identical to the input address IN_ADD is stored, from among the first to $N^{th}$ storage units 421_1 to 421_8, is reset. To reset the storage unit means that a value stored in the storage unit is deleted and the storage unit becomes an initial state. For this operation, the first to $N^{th}$ storage units 421_1 to 421_8 are reset, irrespective of whether they are activated or not, when the respective first to $N^{th}$ comparison signals CMP1 to CMP8 are activated.

In the reset operation, the first to $N^{th}$ comparison units 422_1 to 422_8 activate the respective first to $N^{th}$ comparison signals CMP1 to CMP8 when the second addresses stored in the respective first to $N^{th}$ storage units 421_1 to 421_8 are identical to the input address IN_ADD. In the access operation, the first to $N^{th}$ comparison units 422_1 to 422_8 activate the respective first to $N^{th}$ comparison signals CMP1 to CMP8 when the second addresses stored in the respective first to $N^{th}$ storage units 421_1 to 421_8 are identical to the access address ACC_ADD.

That is, when the reset signal INIT is activated, the first to $N^{th}$ comparison units 422_1 to 422_8 compare the second addresses, stored in the respective first to $N^{th}$ storage units 421_1 to 421_8 with the input address IN_ADD. When the reset signal INIT is deactivated, the first to $N^{th}$ comparison units 422_1 to 422_8 compare the second addresses, stored in the respective first to $N^{th}$ storage units 421_1 to 421_8, with the access address ACC_ADD. For reference, the access address ACC_ADD may be an input address received from the outside of the semiconductor device or may be an address generated within the semiconductor device.

The cell array 430 may include first to $M^{th}$ sub-cell arrays 431 to 434 (M=4 is illustrated in FIG. 4, for example). Each of the first to $M^{th}$ sub-cell arrays 431 to 434 may include a plurality of normal cells N_CELL and a plurality of redundancy cells R_CELL. The first to $M^{th}$ sub-cell arrays 431 to 434 include first to $M^{th}$ row control units 431_1 to 434_1, respectively, and first to $M^{th}$ column control units 431_2 to 434_2, respectively. The first to $M^{th}$ row control units 431_1 to 434_1 activate a word line or redundancy word line, selected in response to the access address ACC_ADD or the comparison signals CMP1 to CMP8, in response to the access command ACC_CMD, and the first to $M^{th}$ column control units 431_2 to 434_2 access data stored in a bit line selected in the access operation. The operations of the first to $M^{th}$ row control units 431_1 to 434_1 are mainly described below. The cell array 430 may include one or more sub-cell arrays depending on the design. For reference, the sub-cell array may be a cell array, such as a dynamic random access memory (DRAM), static RAM (SRAM), or magnetic RAM (MRAM).

In the access operation, the first to $M^{th}$ row control units 431_1 to 434_1 activate a word line WL corresponding to the access address ACC_ADD when all of the second addresses STO_ADD1 to STO_ADD8 stored in the address storage unit 420 are not identical to the access address ACC_ADD, and access the normal cells N_CELL. When any of the second addresses STO_ADD1 to STO_ADD8 stored in the address storage unit 420 is identical to the access address ACC_ADD, the first to $M^{th}$ row control units 431_1 to 434_1 activate a redundancy word line RWL corresponding to an activated comparison signal, from among the first to $N^{th}$ comparison signals CMP1 to CMP8 (N=8 is illustrated in FIG. 4, for example), and access the redundancy cells R_CELL. Here, redundancy cells R_CELL corresponding to the activated comparison signal are cells that replace normal cells N_CELL corresponding to the access address ACC_ADD.

Hereinafter, an example in which the first addresses stored in the non-volatile storage unit 410 is assumed to be an address of a word line WL to be replaced, the first to $N^{th}$ comparison signals CMP1 to CMP8 correspond to the respective first to Nth redundancy word lines RWL1 to RWL8 and each of the first to $M^{th}$ sub-cell arrays 431 to 434 includes two redundancy word lines, is described.

For reference, in case where the semiconductor device is a semiconductor memory device, an access operation may be one of a write operation for writing data into one or more normal cells N_CELL or one or more redundancy cells R_CELL, a read operation for reading data from one or more normal cells N_CELL or one or more redundancy cells R_CELL, and a refresh operation for refreshing the data of one or more normal cells N_CELL or one or more redundancy cells R_CELL.

In the access operation, the first to $M^{th}$ row control units 431_1 to 434_1 of the first to $M^{th}$ sub-cell arrays 431 to 431 activate a word line WL corresponding to the access address ACC_ADD when all of the first to $N^{th}$ comparison signals CMP1 to CMP8 are deactivated, but activate a redundancy word line corresponding to one or more activated comparison signals when one or more of the first to $N^{th}$ comparison signals CMP1 to CMP8 are activated.

For reference, in FIG. 4, the first and the fifth comparison signals CMP1 and CMP5 correspond to the first and the fifth redundancy word lines RWL1 and RWL5 of the first sub-cell array 431, the third and the sixth comparison signals CMP2 and CMP6 correspond to the third and the sixth redundancy word lines RWL2 and RWL6 of the second sub-cell array 432, the third and the seventh comparison signals CMP3 and CMP7 correspond to the third and the seventh redundancy word lines RWL3 and RWL7 of the third sub-cell array 433 and the fourth and the eighth comparison signals CMP4 and CMP8 correspond to fourth and the eighth redundancy word lines RWL4 and RWL8 of the fourth sub-cell array 434.

The operation of the semiconductor device may be basically divided into (1) a reset operation and (2) an access operation. An overall operation of the semiconductor device is divided into (1) the reset operation and (2) the access operation, which are described below.

(1) Reset Operation

When the reset signal INIT is activated, one or more first addresses are sequentially inputted from the non-volatile storage unit 410 to the address storage unit 420. The first to $N^{th}$ storage units 421_1 to 421_8 are sequentially activated and the input address IN_ADD of the first addresses is stored in the activated storage units 421_1 to 421_8. At this time, the first to $N^{th}$ comparison units 422_1 to 422_8 compare the second addresses STO_ADD1 to STO_ADD8, stored in the corresponding storage units, with the input address IN_ADD and generate the first to $N^{th}$ comparison signals CMP1 to CMP8. When any of the first to $N^{th}$ comparison signals CMP1 to CMP8 is activated, a storage unit corresponding to an activated comparison signal is reset i.e., a stored address is deleted. In accordance with this operation, two or more redundant addresses are not stored in the address storage unit 420 although the redundant addresses are stored in the non-volatile storage unit 410.

(2) Access Operation

When the reset signal INIT is deactivated, the non-volatile storage unit 410 does not output the first addresses. All of the first to $N^{th}$ storage units 421_1 to 421_8 are deactivated, and thus the second addresses stored in the first to $N^{th}$ storage units 421_1 to 421_8 remain intact. When the access address ACC_ADD is received along with the access command ACC_CMD, the first to $N^{th}$ comparison units 422_1 to 422_8 compare the second addresses STO_ADD1 to STO_ADD8, stored in the first to $N^{th}$ storage units 421_1 to 421_8 with the access address ACC_ADD and generate the first to $N^{th}$ comparison signals CMP1 to CMP8. When all of the first to Nth comparison signals CMP1 to CMP8 are deactivated, the first to $M^{th}$ row control units 431_1 to 434_1 activate a word line WL, corresponding to the access address ACC_ADD, in response to the access command ACC_CMD. When any of the first to $N^{th}$ comparison signals CMP1 to CMP8 is activated, the first to $M^{th}$ row control units 431_1 to 434_1 activate a redundancy word line corresponding to the activated comparison signal in response to the access command ACC_CMD. For reference, the access command ACC_CMD may be any one of a write command, a read command, and a refresh command. When the comparison result signal CMP_SUM is activated, the first to $M^{th}$ row control units 431_1 to 434_1 do not activate the word line WL.

The semiconductor device in accordance with the exemplary embodiment deletes the redundant addresses in the address storage unit 420 when storing addresses from the non-volatile storage unit 410 to the address storage unit 420 although the redundant addresses are stored in the non-volatile storage unit 410. Accordingly, the concern described with reference to FIG. 3 is not generated because the redundant addresses are not stored in the address storage unit 420.

In the description of FIG. 4, an example which the address stored in the non-volatile storage unit 410 is an address i.e., a row address, corresponding to a word line has been described. However, the address stored in the non-volatile storage unit 410 may be an address, i.e., a column address, corresponding to a bit line depending on the design. In the former case, the semiconductor device stores the address from the non-volatile storage unit 410 to the address storage unit 420, and uses the stored address when performing a row redundancy operation. In the latter case, the semiconductor device stores the address from the non-volatile storage unit 410 to the address storage unit 420, and uses the stored address when performing a column redundancy operation. The redundancy operation refers to an operation for replacing a defective part within the cell array 430 with a redundancy circuit.

A semiconductor device in accordance with another embodiment of the present invention is described below with reference to FIG. 4.

Referring to FIG. 4, the semiconductor device includes the non-volatile storage unit 410, the first to $N^{th}$ storage units 421_1 to 421_8 sequentially activated and configured to store data received from the non-volatile storage unit 410 when they are activated, and the first to $N^{th}$ comparison units 422_1 to 422_8 configured to compare data, stored in the respective first to $N^{th}$ storage units 421_1 to 421_8, with the input data.

The non-volatile storage unit 410 continuously outputs data the first to $N^{th}$ storage units 421_1 to 421_8, and the input data is stored in an activated storage unit of the first to $N^{th}$ storage units 421_1 to 421_8. A storage unit in which data identical to the input data is stored, from among the first to $N^{th}$ storage units 421_1 to 421_8, is reset in response to the first to $N^{th}$ comparison signals CMP1 to CMP8 outputted from the first to $N^{th}$ comparison units 422_1 to 422_8.

The input data corresponds to the input address IN_ADD described with reference to FIG. 4, and the data stored in the storage units correspond to the second addresses STO_ADD1 to STO_ADD8 stored in the storage units described with reference to FIG. 4. A detailed operation of the semiconductor device is the same as that described with reference to FIG. 4, and a description thereof is omitted.

The semiconductor device in accordance with the exemplary embodiment deletes redundant data in a process of sending the data from the non-volatile storage unit 410 to the first to $N^{th}$ storage units 421_1 to 421_8 although the redundant data is stored in the non-volatile storage unit 410 so that the redundant data is not stored in the first to $N^{th}$ storage units 421_1 to 421_8.

Figure 5:
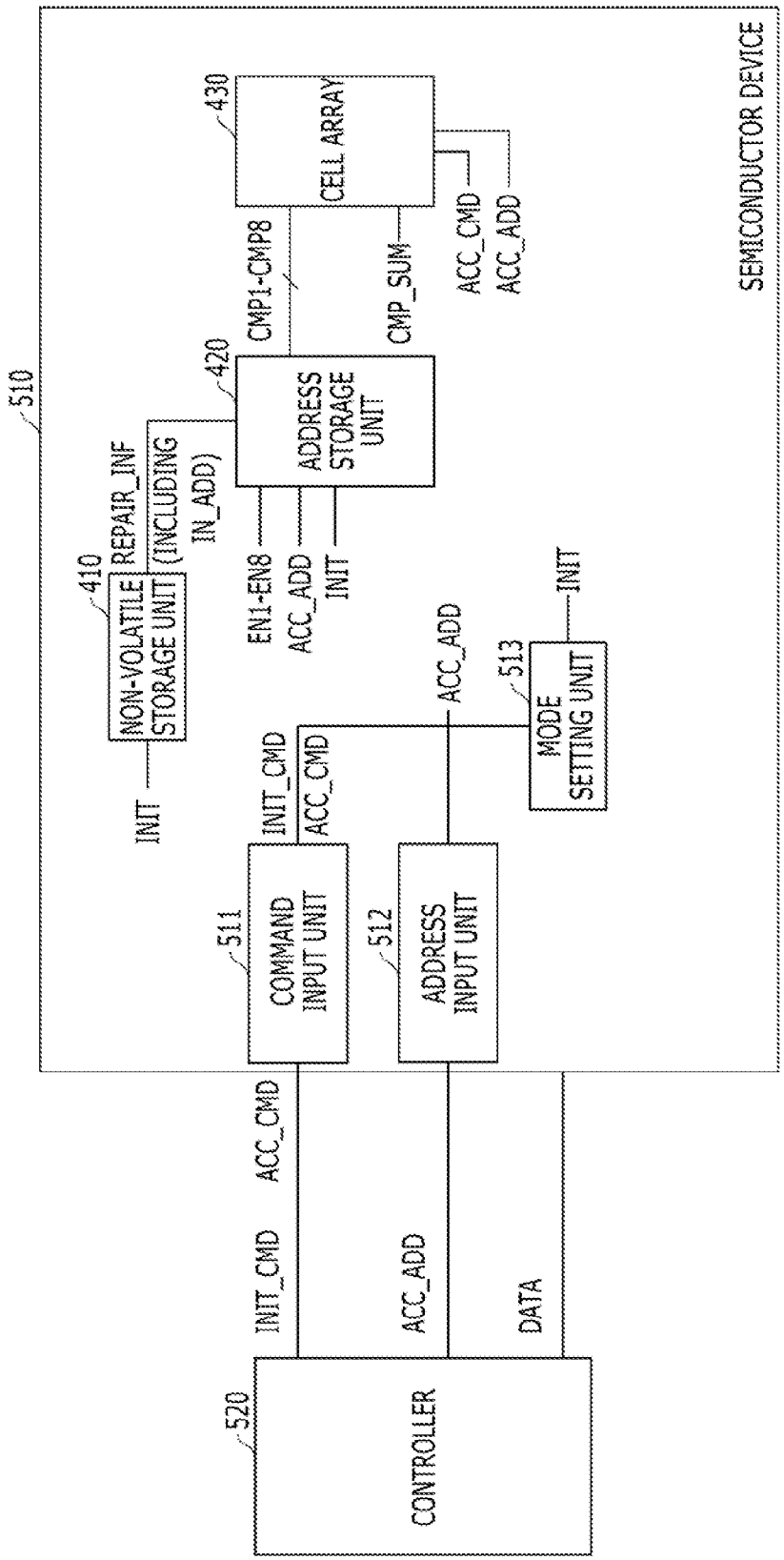
FIG. 5 is a block diagram illustrating a semiconductor system in accordance with an exemplary embodiment of the present invention.

FIG. 5 illustrates a block diagram of a semiconductor system in accordance with an exemplary embodiment of the present invention.

As illustrated in FIG. 5, the semiconductor system includes a semiconductor device 510 and a controller 520. The semiconductor device 510 includes the non-volatile storage unit 410 for storing one or more first addresses, the address storage unit 420 for storing the first addresses that are sequentially received from the non-volatile storage unit 410 as second addresses in response to a reset command INIT_CMD while deleting previously store second addresses identical to a current input address IN_ADD of the first addresses to be stored, and the cell array 430 for replacing one or more normal cells N_CELL with one or more redundancy cells R_CELL using the second addresses stored in the address storage unit 420 in response to an access command ACC_CMD. In a reset operation, the controller 520 outputs the reset command INIT_CMD to the semiconductor device 510, and, in an access operation, the controller 520 outputs the access command ACC_CMD and the access address ACC_ADD, to the semiconductor device 510. The semiconductor device 510 of FIG. 5 further includes a command input unit 511 for receiving the command INIT_CMD and ACC_CMD, an address input unit 512 for receiving the access address ACC_ADD, and a mode setting unit 513 for setting mode of the semiconductor device 510.

The semiconductor system is described below with reference to FIGS. 4 and 5.

The controller 520 outputs the reset command INIT_CMD to the semiconductor device 510 so that the semiconductor device 510 performs the reset operation, and outputs the access command ACC_CMD, the access address ACC_ADD, and data DATA to the semiconductor device 510 so that the semiconductor device 510 performs the access operation.

The command input unit 511 of the semiconductor device 510 receives the reset command INIT_CMD and the access command ACC_CMD from the controller 520. The address input unit 512 of the semiconductor device 510 receives the access address ACC_ADD from the controller 520.

The mode setting unit 513 sets the semiconductor device 510 in response to the reset command INIT_CMD and the access command ACC_CMD received from the command input unit 511 so that the semiconductor device 510 performs the reset operation or the access operation. The mode setting unit 513 may activate a reset signal INIT in response to the reset command INIT_CMD and may deactivate the reset signal INIT in response to the access command ACC_CMD.

The operation of the semiconductor device 510, when the reset operation and the access operation are performed is the same as that described with reference to FIG. 4, and a description thereof is omitted.

Figure 6:
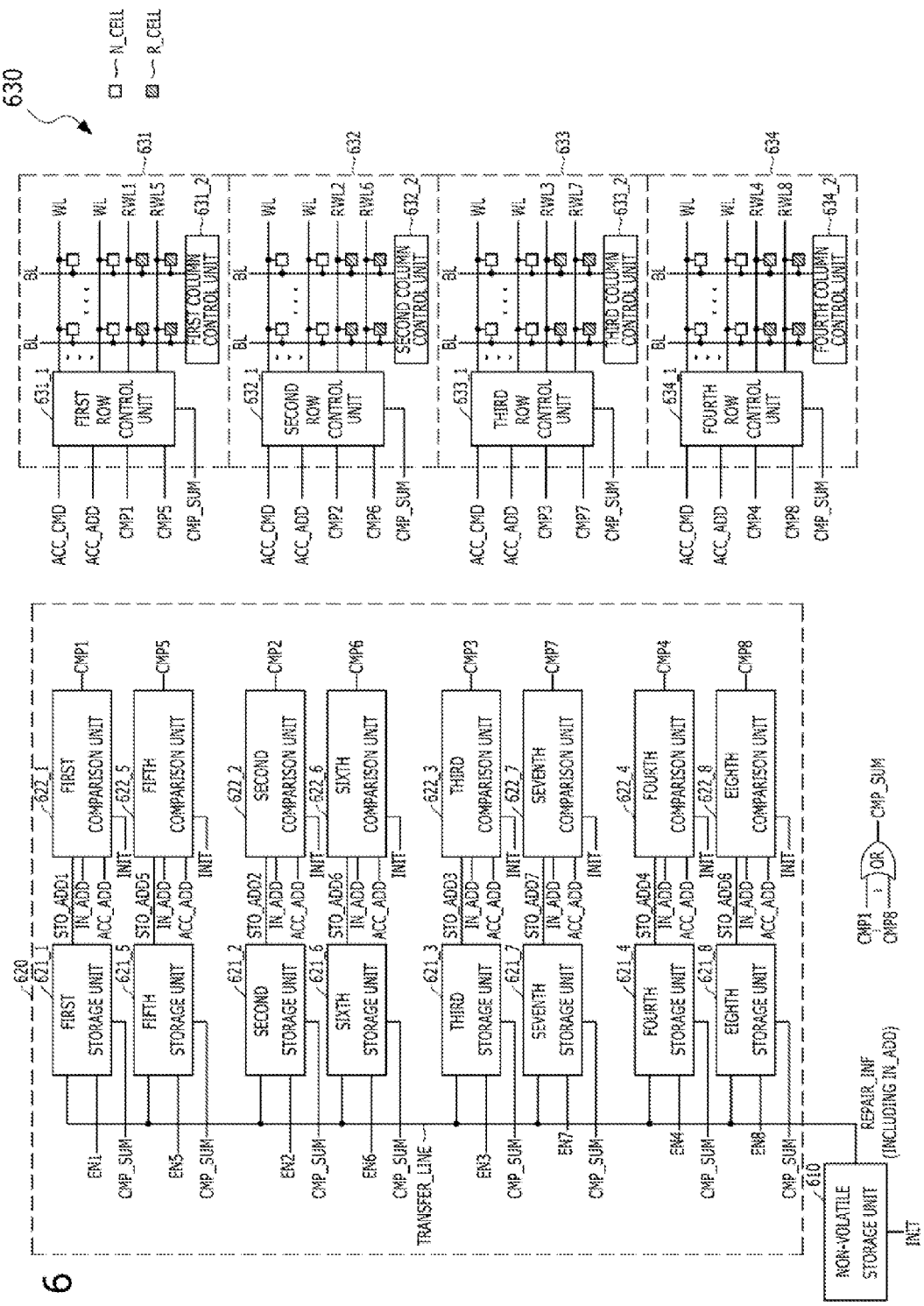
FIG. 6 is a block diagram illustrating a semiconductor device in accordance with another exemplary embodiment of the present invention.

FIG. 6 illustrates a block diagram of a semiconductor device in accordance with another exemplary embodiment of the present invention.

As illustrated in FIG. 6, the semiconductor device includes a non-volatile storage unit 610 for storing one or more first addresses, an address storage unit 620 for storing the first addresses sequentially received from the non-volatile storage unit 610 as second addresses STO_ADD1 to STO_ADD8 in a reset operation while not storing a current input address IN_ADD of the first addresses when any of the previously stored second addresses is identical to the current input address IN_ADD, and a cell array 630 for replacing one or more normal cells N_CELL with one or more redundancy cells R_CELL using the second addresses STO_ADD1 to STO_ADD8 stored in the address storage unit 620 in an access operation.

The semiconductor device is described below with reference to FIG. 6.

The fuse circuits 140 and 160 of FIG. 1 are replaced with the non-volatile storage unit 610. Repair information corresponding to the cell array 630, e.g., addresses of normal cells to be replaced, are stored in the non-volatile storage unit 610. The non-volatile storage unit 610 may include an E-fuse array or various types of non-volatile memory, such as flash memory and EEPROM. The non-volatile storage unit 610 outputs the repair information REPAIR_INF, received through a transfer line TRANSFER_LINE, to the address storage unit 620 in the reset operation. The repair information REPAIR_INF includes the first addresses, and the first addresses are sequentially inputted to the address storage unit 620 in the reset operation.

Meanwhile, the non-volatile storage unit 610 may store both a row address for controlling a row redundancy operation and a column address for controlling a column redundancy operation. For example, in the case of a row redundancy operation, in order to describe the operation of the semiconductor device, it is assumed that row addresses are stored in the non-volatile storage unit 610 and the row addresses are inputted to the address storage unit 620 and stored therein as the repair information REPAIR_INF in the reset operation. A detailed description of the column redundancy operation is omitted below.

In the reset operation, the address storage unit 620 stores the first addresses sequentially received from the non-volatile storage unit 610 as the second addresses STO_ADD1 to STO_ADDS, but does not store the current input address IN_ADD when any of the previously stored second addresses is identical to the current input address IN_ADD. Here, the first and second addresses may correspond to the row addresses, and the previously stored second addresses refer to an address received and stored prior to the current input address IN_ADD in the reset operation.

The address storage unit 620 includes first to N storage units 621_1 to 621_8 for storing the first addresses as the second addresses one to one, and first to $N^{th}$ comparison units 622_1 to 622_8 for comparing the second addresses with one of the input address IN_ADD and the access address ACC_ADD and generating first to $N^{th}$ comparison signals CMP1 to CMP8, respectively.

The first to $N^{th}$ storage units 621_1 to 621_8 store the input address IN_ADD when they are activated. The first to $N^{th}$ storage units 621_1 to 621_8 are sequentially activated in the reset operation. For example, the first storage unit 621_1 to the $N^{th}$ storage unit 621_N may be sequentially activated. All of the first to $N^{th}$ storage units 621_1 to 621_8 are deactivated in the access operation. A reset signal INIT indicates whether the semiconductor device is in a reset operation or not. The reset signal INIT is activated when the semiconductor device is in the reset operation and is deactivated when the semiconductor device is in the access operation. The first to $N^{th}$ storage units 621_1 to 621_8 may be sequentially activated when the reset signal INIT is activated and may be deactivated when the reset signal INIT is deactivated.

For reference, a description of the second addresses STO_ADD1 to STO_ADDS and first to $N^{th}$ enable signals EN1 to EN8 is the same as that given with reference to FIG. 4.

In the reset operation, when a storage unit in which an address identical to the input address IN_ADD is stored is present in the first to $N^{th}$ storage units 621_1 to 621_8, an activated storage unit does not store the input address IN_ADD. For this operation, the first to $N^{th}$ storage units 421_1 to 421_8 do not store the input address IN_ADD although they are activated when a comparison result signal CMP_SUM is activated. The comparison result signal CMP_SUM is activated when any of the first to $N^{th}$ comparison signals CMP1 to CMP8 is activated.

The construction and operation of the first to $N^{th}$ comparison units 622_1 to 622_8 and the cell array 630 are the same as those of the first to $N^{th}$ comparison units 422_1 to 422_8 and the cell array 430 of FIG. 4, and a description thereof is omitted.

The operation of the semiconductor device may be basically divided into (1) a reset operation and (2) an access operation. An overall operation of the semiconductor device is divided into (1) the reset operation and (2) the access operation, which are described below.

(1) Reset Operation

When the reset signal INIT is activated, one or more first addresses are sequentially inputted from the non-volatile storage unit 610 to the address storage unit 620. The first to $N^{th}$ storage units 621_1 to 621_8 are sequentially activated, and the input address IN_ADD of the first addresses is stored in the activated storage units. At this time, the first to $N^{th}$ comparison units 622_1 to 622_8 compare the second addresses STQ_ADD1 to STO_ADD8, stored in the corresponding storage units, with the input address IN_ADD and generate the first to $N^{th}$ comparison signals CMP1 to CMP8. When any of the first to $N^{th}$ comparison signals CMP1 to CMP8 is activated, a storage unit corresponding to an activated comparison signal does not store the input address IN_ADD. In accordance with this operation, two or more redundant addresses are not stored in the address storage unit 620 although the redundant addresses are stored in the non-volatile storage unit 610.

(2) Access Operation

In an access operation, the semiconductor device operates like that described with reference to FIG. 4.

The semiconductor device in accordance with the exemplary embodiment does not store the redundant addresses in the address storage unit 620 when storing addresses from the non-volatile storage unit 610 to the address storage unit 620 although the redundant addresses are stored in the non-volatile storage unit 610. Accordingly, the concern described with reference to FIG. 3 is not generated because the redundant addresses are not stored in the address storage unit 620.

In the description of FIG. 6, an example in which the address stored in the non-volatile storage unit 610 is an address i.e., a row address, corresponding to a word line has been described. However, the address stored in the non-volatile storage unit 610 may be an address i.e., a column address, corresponding to a bit line. In the former case, the semiconductor device stores the address from the non-volatile storage unit 610 to the address storage, unit 620 and uses the stored address when performing a row redundancy operation. In the latter case, the semiconductor device stores the address from the non-volatile storage unit 610 to the address storage unit 620 and uses the stored address when performing a column redundancy operation.

The semiconductor device in accordance with another embodiment of the present invention is described below with reference to FIG. 6.

Referring to FIG. 6, the semiconductor device includes the non-volatile storage unit 610, the first to $N^{th}$ storage units 621_1 to 621_8 sequentially activated and configured to store input data received from the non-volatile storage unit 610 when being activated, and the first to $N^{th}$ comparison units 622_1 to 622_8 configured to compare data, stored in the respective first to $N^{th}$ storage units 621_1 to 621_8 with the input data.

The non-volatile storage unit 610 continuously outputs data to the first to $N^{th}$ storage units 621_1 to 621_8, and the input data is stored in an activated storage unit of the first to $N^{th}$ storage units 621_1 to 621_8. When any of the first to $N^{th}$ comparison signals CMP1 to CMP8 is activated so as to activate the comparison result signal CMP_SUM, the first to $N^{th}$ storage units 421_1 to 421_8 do not store the input data although they are activated.

The input data corresponds to the input address IN_ADD described with reference to FIG. 6, and the data stored in the storage units correspond to the second addresses STO_ADD1 to STO_ADD8 stored in the storage units described with reference to FIG. 6. A detailed operation of the semiconductor device is the same as that described with reference to FIG. 6.

The semiconductor device in accordance with the exemplary embodiment stores redundant data only once in a process of sending the data from the non-volatile storage unit 610 to the first to $N^{th}$ storage units 621_1 to 621_8 although the redundant data are stored in the non-volatile storage unit 610 so that the redundant data are not stored in the first to $N^{th}$ storage units 621_1 to 621_8.

Figure 7:
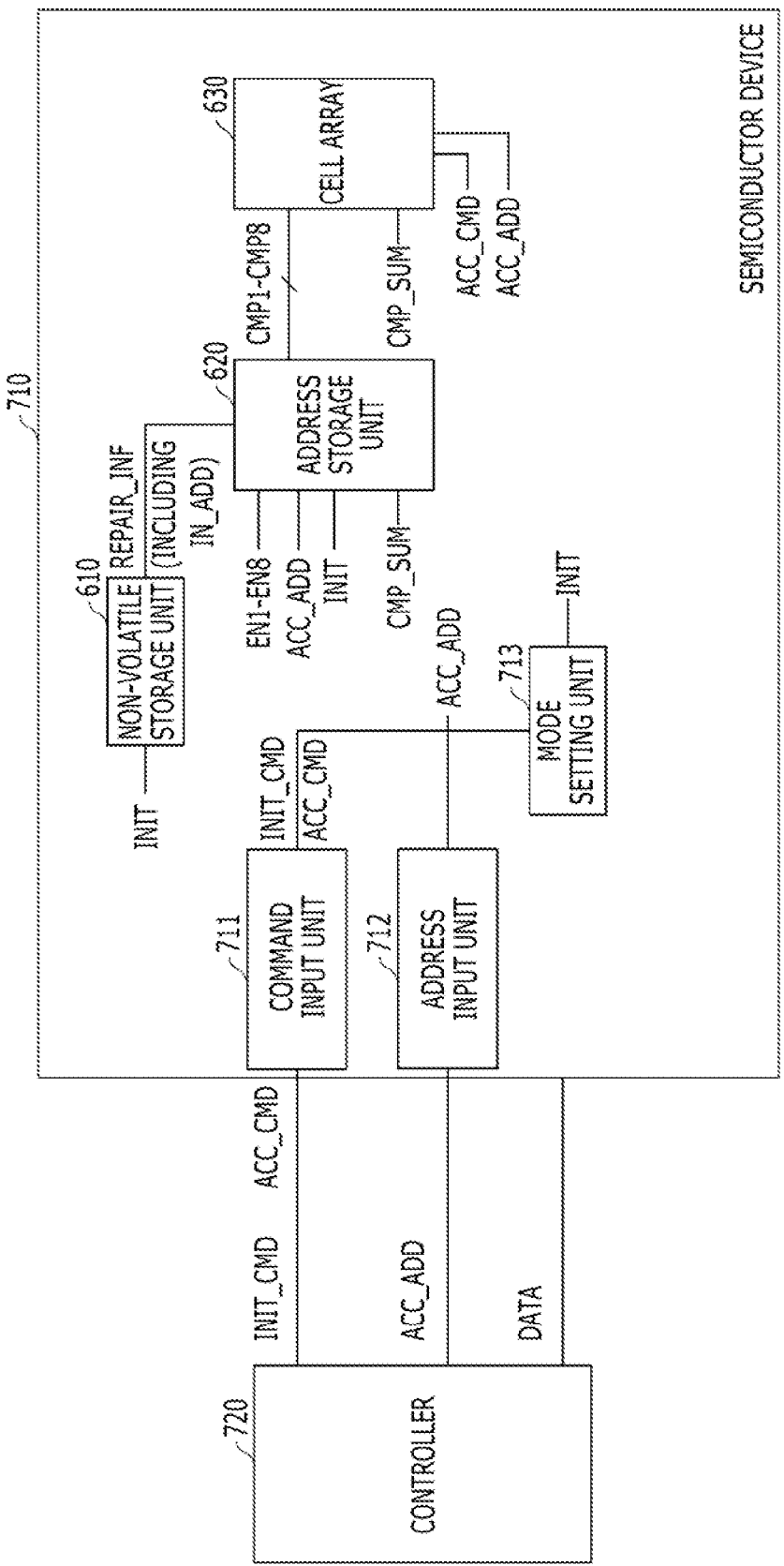
FIG. 7 is a block diagram illustrating a semiconductor system in accordance with another exemplary embodiment of the present invention.

FIG. 7 illustrates a block diagram of a semiconductor system in accordance with another exemplary embodiment of the present invention.

As illustrated in FIG. 7, the semiconductor system includes a semiconductor device 710 and a controller 720. The semiconductor device 710 includes the non-volatile storage unit 610 for storing one or more first addresses, the address storage unit 620 for storing the first addresses sequentially received from the non-volatile storage unit 610 as second addresses in response to a reset command INIT_CMD while not storing a current input address IN_ADD of the first addresses when any of the previously stored second addresses is identical to the current input address IN_ADD, and the cell array 630 for replacing one or more normal cells N_CELL with one or more redundancy cells R_CELL using the second addresses stored in the address storage unit 620 in response to the access command ACC_CMD. In a reset operation, the controller 720 outputs the reset command INIT_CMD to the semiconductor device 710, and, in an access operation, the controller 720 outputs the access command ACC_CMD and the access address ACC_ADD to the semiconductor device 710. The semiconductor device 710 of FIG. 7 further includes a command input unit 711 for receiving the commands INIT_CMD and ACC_CMD, an address input unit 712 for receiving the access address ACC_ADD, and a mode setting unit 713 for setting mode of the semiconductor device 710.

The semiconductor system is described below with reference to FIGS. 6 and 7.

The controller 720 outputs the reset command INIT_CMD to the semiconductor device 710 so that the semiconductor device 710 performs the reset operation and outputs the access command ACC_CMD, the access address ACC_ADD, and data DATA to the semiconductor device 710 so that the semiconductor device 710 performs the access operation.

The command input unit 711 of the semiconductor device 710 receives the reset command INIT_CMD and the access command ACC_CMD from the controller 720. The address input unit 712 of the semiconductor device 710 receives the access address ACC_ADD from the controller 720.

The mode setting unit 713 sets mode of the semiconductor device 710 in response to the reset command INIT_CMD and the access command ACC_CMD inputted to the command input unit 711 so that the semiconductor device 710 performs the reset operation or the access operation. The mode setting unit 713 may activate a reset signal INIT in response to the reset command INIT_CMD and may deactivate the reset signal INIT in response to the access command ACC_CMD.

The operation of the semiconductor device 710 when the reset operation and the access operation are performed is the same as that described with reference to FIG. 6, and a description thereof is omitted.

In accordance with an exemplary embodiment of the present invention, redundant data/addresses are stored only once when data/addresses are transferred from the non-volatile storage unit of the semiconductor device to the storage unit of the semiconductor device. Thus, although the redundant data/addresses are stored in the non-volatile storage unit, the redundant data/addresses are not stored in the storage unit.

While the present invention has been described with respect to the specific embodiments, it will be apparent to triose skilled in the art that various changes and modifications may be made without departing from the spirit and scope of the invention as defined in the following claims

What is claimed is:

1. A semiconductor device comprising:
   a non-volatile storage unit suitable for storing one or amore first addresses;
   an address storage unit suitable for storing the first addresses sequentially received from the non-volatile storage unit as second addresses and deleting previously stored second addresses identical to an input address of the first addresses, in a reset operation; and a cell array suitable for replacing one or more normal cells with one or more redundancy cells based on the second addresses in an access operation.

2. The semiconductor device of claim 1, wherein the cell array accesses the normal cells corresponding to an access address when all of the second addresses are not identical to the access address, and accesses the redundancy cells replacing the normal cells corresponding to the access address when any of the second addresses is identical to the access address, in the access operation.

3. The semiconductor device of claim 1, wherein the address storage unit comprises:

first to $N^{th}$ storage units each suitable for storing one of the second addresses; and first to $N^{th}$ comparison units suitable for comparing the second addresses with one of the input address and an access address and generating respective first to $N^{th}$ comparison signals.

4. The semiconductor device of claim 3, wherein the first to $N^{th}$ storage units are sequentially activated, and the input address is stored in an activated storage unit of the first to $N^{th}$ storage units, in the reset operation.

5. The semiconductor device of claim 4, wherein the first to $N^{th}$ comparison units activate the respective first to $N^{th}$ comparison signals and a storage unit corresponding to an activated comparison signal from among the first to $N^{th}$ storage units, is reset, when the input address is identical to the second addresses, in the reset operation.

6. The semiconductor device of claim 3, wherein all of the first to $N^{th}$ storage units are deactivated, and the first to $N^{th}$ comparison units activate the respective first to $N^{th}$ comparison signals when the second addresses are identical to the access address, in the access operation.

7. The semiconductor device of claim 6, wherein the cell array accesses the redundancy cells corresponding to an activated comparison signal of the first to $N^{th}$ comparison signals when any of the first to $N^{th}$ comparison signals is activated, but accesses the normal cells corresponding to the access address when all of the first to $N^{th}$ comparison signals are deactivated.

8. The semiconductor device of claim 6, wherein the cell array comprises:

first to $M^{th}$ sub-cell arrays corresponding to one or more of the first to $N^{th}$ storage units, each including a plurality of normal cells and a plurality of redundancy cells.

9. The semiconductor device of claim 8, wherein each of the first to $M^{th}$ sub-cell arrays accesses the redundancy cells included in each sub-cell array when a comparison signal corresponding to each sub-cell array, from among the first to $N^{th}$ comparison signals, is activated, but accesses the normal cells included in each sub-cell array in response to the access address when all of the first to $N^{th}$ comparison signals are deactivated, in the access operation.

10. The semiconductor device of claim 1, wherein, when the semiconductor device is a semiconductor memory device, the access operation is one of a write operation for writing data into the normal cells or the redundancy cells, a read operation for reading the data from the normal cells or the redundancy cells, and a refresh operation for refreshing the data of the normal cells or the redundancy cells.

11. The semiconductor device of claim 1, wherein:
the non-volatile storage unit comprises an E-fuse array, and the cell array comprises a dynamic random access memory (DRAM) cell array.

12. A semiconductor device comprising:
a non-volatile storage unit;
first to $N^{th}$ storage units sequentially activated and suitable for storing input data received from the non-volatile storage unit when the first to $N^{th}$ storage units are activated; and
first to $N^{th}$ comparison units suitable for comparing data, stored in the respective first to $N^{th}$ storage units, with the input data,
wherein a storage unit which stores data identical to the input data, from among the first to $N^{th}$ storage units, is reset based on a comparison result of the first to $N^{th}$ comparison units.

13. The semiconductor device of claim 12, wherein the non-volatile storage unit continuously outputs data to the first to $N^{th}$ storage units.

14. A semiconductor device comprising:
a non-volatile storage unit suitable for storing one or ore first addresses;
an address storage unit suitable for storing the first addresses sequentially received from the non-volatile storage unit while not storing an input address of the first addresses when any of the previously stored second addresses is identical to the input address, in a reset operation; and
a cell array suitable for replacing one or more normal cells with one or more redundancy cells based on the second addresses, in an access operation.

15. The semiconductor device of claim 14, wherein the cell array accesses the normal cells corresponding to an access address when all of the second addresses are identical to the access address, and accesses the redundancy cells replacing the normal cells corresponding to the access address when any of the second addresses is identical to the access address, in the access operation.

16. The semiconductor device of claim 14, wherein the address storage unit comprises:

first to $N^{th}$ storage nits each suitable for storing one of the second addresses; and first to $N^{th}$ comparison units suitable for comparing the second addresses with one of the input address and an access address and generating respective first to $N^{th}$ comparison signals.

17. The semiconductor device of claim 16, wherein the first to $N^{th}$ storage units are sequentially activated, and the input address is stored in an activated storage unit of the first to $N^{th}$ storage units, in the reset operation.

18. The semiconductor device of claim 17, wherein the first to $N^{th}$ comparison units activate the respective first to $N^{th}$ comparison signals and a storage unit corresponding to an activated comparison signal from among the first to $N^{th}$ storage units, does not store the input address, when the input address is identical to the second addresses, in the reset operation.

* * * * *